United States Patent
Frings et al.

(10) Patent No.: US 6,770,686 B2
(45) Date of Patent: Aug. 3, 2004

(54) PHOTOCATIONIC INITIATOR COMBINATIONS

(75) Inventors: Rainer B. Frings, Berlin (DE); Gerwald F. Grahe, Berlin (DE)

(73) Assignee: Dainippon Ink and Chemicals, Inc., Tokyo (JP)

(*) Notice: Subject to any disclaimer, the term of this patent is extended or adjusted under 35 U.S.C. 154(b) by 235 days.

(21) Appl. No.: 10/155,220

(22) Filed: May 28, 2002

(65) Prior Publication Data

US 2003/0027882 A1 Feb. 6, 2003

(30) Foreign Application Priority Data

May 28, 2001 (EP) ............................................. 01112078

(51) Int. Cl.$^7$ ........................ C08G 59/68; C09D 63/00; G03F 7/00
(52) U.S. Cl. ................. 522/13; 16/24; 16/27; 16/170; 16/83
(58) Field of Search ............................. 522/13, 16, 24, 522/27, 83, 170

(56) References Cited

U.S. PATENT DOCUMENTS 4,405,765 A * 9/1983 Demmler et al. ........... 525/506
4,474,868 A    10/1984 Yamaoka et al.
4,746,685 A * 5/1988 Masuhara et al. ............ 522/13
4,824,876 A * 4/1989 Matsumoto et al. .......... 522/24

FOREIGN PATENT DOCUMENTS

EP    0 213 893 A2    3/1987

OTHER PUBLICATIONS

Derwent Publications Ltd., No. XP002178516, Aug. 30, 1989, JP 1216383A.

E. P. O. Patent Abstract of Japan, Publication No. 59142205, dated Aug. 15, 1984.

Patent Abstract of Japan, Publication No. 07316262, dated May 12, 1995.

* cited by examiner

Primary Examiner—Susan Berman
(74) Attorney, Agent, or Firm—Armstrong, Kratz, Quintos, Hanson & Brooks, LLP

(57) ABSTRACT

New photocationic photoinitiator combinations are described that consist of 2,4,6-triarylpyrylium salts with non-nucleophilic anions and electron donors, that are able rapidly to crosslink unpigmented as well as pigmented mixtures based on cycloaliphatic epoxides to form colourless layers such as lacquers and printing inks without generating interfering and toxic emissions.

13 Claims, No Drawings

PHOTOCATIONIC INITIATOR COMBINATIONS

BACKGROUND OF THE INVENTION

1. Field of the Invention

The present invention relates to a photocationic initiator combination, a UV-crosslinkable epoxide mixture containing this initiator combination, as well as its use as a lacquer, printing ink or adhesive.

2. Description of Related Art

The photocationic crosslinking of difunctional and polyfunctional epoxides and vinyl ethers is employed for light-hardening lacquers and printing inks since the crosslinking takes place without any problem in the presence of atmospheric oxygen, in contrast to the photo-radical crosslinking of acrylates, and lacquers, above all those based on cycloaliphatic epoxides, exhibit on account of their low degree of shrinkage a very good adhesion to various substrates such as tinplate, aluminium, and to many types of plastics materials. The low level of odour development and the low vapour pressure of the cycloaliphatic epoxides that are principally used is also an advantage.

Suitable initiators for the photocationic crosslinking are onium salts with complex, non-nucleophilic anions, in which connection triarylsulfonium salts and diaryliodonium salts in particular with hexafluorophosphate, hexafluoroarsenate or hexafluoroantimonate anions, as are described by J. Crivello and various co-authors in, inter alia, J. of Polym. Sc., Polym. Chem. Ed., 18, 2677–2695 (1980); in J. Radiation Curing 10 (1), 6–13 (1983) and in U.S. Pat. Nos. 4,058,400, 4,102,687, 4,161,478 and 4,423,136, have been introduced in industry.

These initiators decompose under irradiation with light of a wavelength range <350 nm first of all into radicals that then release protons in secondary reactions with the solvent or the monomer, as has been shown by S. P. Pappas in J. of Imaging Technology 11 (4), 146–157 (1985) and by J. L. Dektar and N. P. Hacker in J. Am. Chem. Soc. 112, 6004–6015 (1990). The strong acids $HPF_6$, $HSbF_6$ or $HAsF_6$ that are thereby formed then constitute the actual initiators for the ring-opening polymerisation of epoxides, preferably epoxycyclohexyl compounds, and the chain polymerisation of high electron density olefins, such as for example vinyl ethers.

The light-induced crosslinking initiated by the protons is adversely affected only by acidic and, above all, basic impurities and by high atmospheric humidity, but not by atmospheric oxygen. Epoxycyclohexyl compounds, in particular 3,4-epoxycyclohexyl-3,4-epoxycyclohexylmethyl ester, are on account of their substantially higher crosslinking rate with respect to aliphatic and aromatic glycidyl ethers and their lower toxicity, the industrially preferred materials for photocationically crosslinkable lacquers. In addition they may also contain in minor amounts of in each case up to 20 wt. %, polyfunctional aliphatic and aromatic glycidyl ethers, olefin diepoxides and OH-containing compounds as co-reactants in order to influence the lacquer properties. Higher weight proportions of such additives reduce the crosslinking rate however.

The triarylsulphonium salts preferably used in industry are mixtures of various aromatic sulfonium salts and are employed as fifty percent solutions in propylene carbonate or γ-butyrolactone. Their hexafluorophosphates are particularly preferred on account of their lower toxicity, although they give rise to lower crosslinking rates than the corresponding hexafluoroantimonates and hexafluoroarsenates. For this reason a mixture of hexafluorophosphates and hexafluoroantimonates is often employed in the case of lacquers that have to harden rapidly but do not come into contact with foodstuffs. The concentration of the photocationic initiator solutions in the case of lacquers and printing inks with wet film thicknesses of 5 and 25 μm is between 2 and 10 wt. %.

Major disadvantages of the photocationic lacquers based on cycloaliphatic epoxides and triarylsulfonium-hexafluorophosphates are their significantly lower crosslinking rate with respect to photoradically crosslinkable acrylate lacquers, and the relatively weak UV absorption of the triarylsulfonium salts and diaryliodonium salts above 320 nm, with the result that they overlap only slightly between 350 and 420 nm with the main emission maxima of the industrially preferred high-pressure mercury vapour lamps. Although this can be compensated by adding photosensitisers such as anthracene or thioxanthones, in particular isopropylthioxanthone, which absorb in the aforementioned wavelength region, the resulting lacquers however then either contain toxicologically harmful polycyclic aromatic hydrocarbons or exhibit a tendency to yellowing.

A further significant disadvantage of the industrially used triarylsulfonium salt photoinitiators is the emission of unpleasantly odiferous and toxic photolysis products such as aromatic sulfides and benzene.

On account of the short wavelength UV maxima of the aforementioned initiators it has therefore hitherto also not been possible to crosslink pigmented epoxide lacquers photocationically since titanium dioxide in its preferred rutile modification completely absorbs light below 400 nm, and also the anatase form with its higher transmission between 350 and 400 nm largely overlaps the absorption of the initiators. At best, only thin pigmented layers a few microns thick, such as are present in printing inks, can be photocationically crosslinked.

BRIEF SUMMARY OF THE INVENTION

The object of the present invention is accordingly to provide a photocationic initiator system whose UV absorption significantly better overlaps the emission range of the metal-doped medium-pressure and high-pressure mercury vapour lamps that are mainly used industrially, between 350 and 420 nm, and that is also suitable for crosslinking pigmented epoxide lacquers.

The present invention accordingly provides a photocationic initiator combination that includes the following components:

(a) at least one 2,4,6-triarylpyrylium salt of the general formula (I)

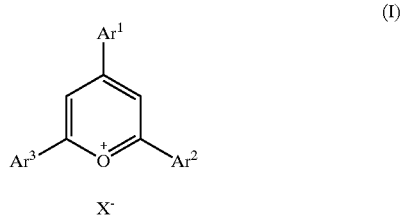

wherein X⁻ denotes a non-nucleophilic anion and $Ar^1$, $Ar^2$ and $Ar^3$ independently of one another in each case denote a phenyl group of the general formula (II) or a biphenyl group of the general formula (III),

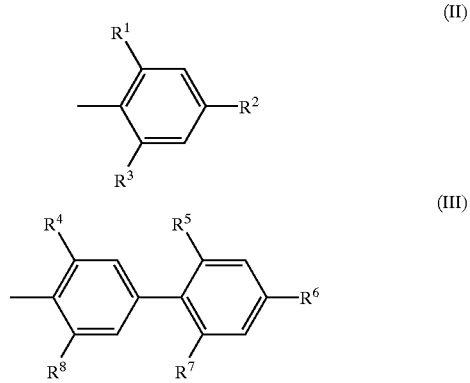

wherein $R^1$ to $R^8$ independently of one another in each case denote hydrogen or an alkyl or alkoxy group with 1 to 12 carbon atoms, and (b) at least one electron donor that forms cations under the action of light in the presence of the aforementioned 2,4,6-triarylpyrylium salt, wherein the electron donor is (i) a combination of an aromatic olefin and an aromatic carbonyl compound with in each case at least two unsubstituted phenyl groups or $C_1$–$C_{12}$-alkyl or $C_1$–$C_{12}$-alkoxy substituted phenyl groups and/or (ii) a radical-forming peroxy or azo compound.

The invention is based on the surprising finding that the photocationic initiator combination according to the invention can very rapidly crosslink unpigmented as well as pigmented epoxide lacquers accompanied by complete decolouration, on irradiation with UV light in the wavelength range from 320 to 420 nm.

This finding is all the more surprising since 2,4,6-triarylpyrylium salts exhibit very strong UV absorptions with molar decadic extinction coefficients of 27–30,000 l/mole·cm between 350 and 450 nm and their solutions in organic solvents and also in cycloaliphatic epoxides are intensely coloured and strongly fluoresce.

DETAILED DESCRIPTION OF THE INVENTION

It is particularly preferred to use such 2,4,6-triarylpyrylium salts in the photocationic photoinitiator combination according to the invention whose long wavelength UV absorption maxima lie between 350 and 420 nm.

Compounds that can generate radicals, such as organic dialkyl, diaryl and diacyl peroxides, peresters and hydroperoxides and radical-forming azo compounds are suitable as components of the initiator combinations according to the invention containing 2,4,6-triarylpyrylium salts.

X⁻ in the aforementioned formula (I) preferably denotes $PF_6^-$, $SbF_6^-$, $AsF_6^-$ or $[B(C_6F_5)_4]^-$.

The initiator combinations according to the invention, in contrast to the known photocationic initiators, do not generate any H⁺ ions, but instead organic carbocations, which moreover can also initiate the thermally and photochemically activated cationic epoxide polymerisation and crosslinking.

The formation of the initiation-active carbocations is based on a photoelectron transfer between the pyrylium salts excited by light in the wavelength range between 300 and 500 nm and radicals photochemically formed in the same wavelength range from photoradical initiators, the said radicals then being oxidised to carbocations, or on the oxidation of aromatic olefins and aromatic carbonyl compounds by photoelectron transfer to the excited pyrylium salt. In this connection the aforementioned compounds to be oxidised should not exhibit any light absorption in the aforementioned wavelength range. 2,4,6-triarylpyranyl radicals are formed by the photoelectron transfer process, which then quickly react further to form colourless products and thus effect the decolouration of the crosslinking lacquer layers.

Combinations found to be particularly effective in practice comprise a 2,4,6-triarylpyrylium salt having an absorption between 350 and 450 nm, a photoradical initiator whose absorption spectrum should exhibit only a slight overlap with the absorption spectrum of the chosen pyrylium salt, and an aromatic olefin and an aromatic carbonyl compound whose absorption spectrum does not overlap with that of the pyrylium salt or of the photoradical initiator. Such initiator combinations may be added in amounts of 2–8 wt. % to liquid cycloaliphatic epoxides or mixtures containing 50–90 wt. % of the latter, wherein the triarylpyrylium salt component alone accounts for only 0.5 to 2 wt. %, the photoradical initiator accounts for 1–5 wt. % and the aromatic olefin or carbonyl component accounts for 1–5 wt. % of the total mixture. In addition there is the solvent fraction that is required to dissolve the triphenylpyrylium salt. The lacquers formulated in this way can be crosslinked at a high crosslinking rate using conventional industrial irradiation equipment to form hard and colourless lacquer films having a high surface quality and good resistance to chemicals. The low odour level of the lacquers and crosslinked films is also advantageous.

The initiator combinations according to the invention can be particularly advantageously used to crosslink pigmented epoxy lacquers, those lacquers pigmented white with $TiO_2$ being particularly preferred, whose pigment/binder ratio may be between 5 and 50 wt. %, preferably between 15 and 35 wt. %, and which may additionally also contain conventional additives such as flow improvers, defoaming agents, UV absorbers and friction resins. The lacquers obtained after the crosslinking are white and have a good gloss, high surface quality and good resistance to chemicals.

Suitable 2,4,6-triarylpyrylium salts for the initiator mixtures according to the invention are for example 2,4,6- triphenylpyrylium hexafluorophosphate, 2,4,6-(4-methylphenyl)pyrylium hexafluorophosphate, 2,6-diphenyl-4-(biphenylyl)pyrylium hexafluorophosphate, 2,4,6-biphenylyl-pyrylium hexafluorophosphate, 2,6-(4-(methoxyphenyl)-4-phenyl-pyrylium hexafluorophosphate, 2,6-diphenyl-4-(4-methoxyphenyl)pyrylium hexafluorophosphate, 2,6-diphenyl-4-(4-dodecylphenyl)pyrylium hexafluorophosphate, 2,6-diphenyl-4-(octyloxyphenyl)pyrylium hexafluorophosphate, 2,6-diphenyl-4-(2-methylphenyl)pyrylium hexafluorophosphate, 2,6-diphenyl-4-(2,4,6-trimethylphenyl)pyrylium hexafluorophosphate, and the corresponding hexafluoroarsenates, hexafluoroantimonates and tetrakis(pentafluorophenyl)borates. Such salts have absorption spectra that overlap well the conventional technical UV/VIS irradiation devices between 350 and 550 nm. Particularly preferred are those salts whose absorption maxima lie between 350 and 420 nm.

The synthesis of such 2,4,6-triarylpyrylium salts may be carried out according to various methods. The condensation of chalcones with unsubstituted or substituted acetophenones in the presence of a trityl salt in ethereal $HBF_4$ solution, as described by K. Dimroth, C. Reichardt and K. Vogel in Organic Synthesis, Coll. Vol. 5, p. 1135, as well as the condensation of acetophenones with benzaldehydes according to the procedure of R. Lombard and J. P. Stephan in Bull. Soc. Chim. Fr. 1458 (1958) have both proved to be particularly suitable.

The pyrylium-tetrafluoroborates obtained in this way can be converted by ion exchange with aqueous alkali metal or ammonium hexafluorophosphates, hexafluoroantimonates or tetrakis(pentafluorophenyl)borate solutions into the corresponding initiator-active 2,4,6-triarylpyrylium salts.

Suitable photoradical initiators, whose n-π* absorption should lie between 320 and 380 nm, are preferably those that under the action of light form radicals by Norrish-1 cleavage, for example:

2-hydroxy-2-methylacetophenone (Darocure-1173™), 1-(4-isopropylphenyl)-2-hydroxy-2-methylacetophenone (Darocure-1116™), 1-hydroxycyclohexylphenyl ketone (Irgacure-184™), 2,2-dimethoxy-2-phenylacetophenone (Irgacure-651™), 2,2-diethoxy-2-phenylacetophenone, benzoin ethyl ether, benzil dimethyl ketal, ω,ω-diethoxyacetophenone. Less suitable, but nevertheless still usable in combination with other photoradical initiators, are those photoradical initiators whose UV absorption strongly overlaps that of the pyrylium salts, such as for example diphenyl(2,4,6-trimethyl-benzoyl)phosphine oxide (Lucirin-TPO™).

Suitable aromatic olefins are those having at least two unsubstituted or substituted phenyl rings, such as for example 1,1-diphenylethylene, trans- and cis-stilbene, 1,1,2-triphenylethylene, tetraphenylethylene and their singly or multiply substituted alkyl and alkoxy derivatives having 1-12 C atoms in the substituents.

Suitable aromatic carbonyl compounds are those having at least two unsubstituted or substituted phenyl rings, for example diphenylacetaldehyde, 2,2,-diphenylacetophenone, 2,2,2,-triphenylacetophenone and their singly or multiply substituted alkyl and alkoxy derivatives having 1–12 C atoms in the substituents.

Suitable organic peroxy compounds are for example tert-butyl hydroperoxide, di-tert-butyl hydroperoxide, dibenzoyl peroxide, dicumyl peroxide, tert-butyl perbenzoate and tert-butyl perdiethyl acetate.

Suitable organic azo compounds are for example 2,2'-azo-bis-(isobutyronitrile) and 1,1'-azo-bis-(1-cyclohexanecarbonitrile). Epoxide mixtures can be effectively crosslinked accompanied by decolouration, by initiator combinations consisting of 0.5–2 wt. % of 2,4,6-triarylpyrylium salt and 1–5 wt. % of one or more organic per or azo compounds, tert-butyl perbenzoate being preferred, referred to the total mixture.

Suitable epoxides for the crosslinking by the initiator combinations according to the invention are for example 3,4-epoxycyclohexyl-(3,4-epoxycyclohexylmethyl ester), adipic acid bis-(3,4-epoxycyclohexylmethyl ester), epoxycyclohexyl esters of polycaprolactone triols, olefin peroxides such as for example vinylcyclohexene oxide, limonene dioxide, butadiene diepoxide, 1,2,7,8-diepoxyoctane, epoxidized polybutadiene, aromatic and aliphatic diglycidyl ethers and polyglycidyl ethers, such as for example bisphenol A diglycidyl ether, and its oligomers extended with bisphenol A, hexanediol-1,6-diglycidyl ether, trimethylolpropanetriglycidyl ether and polydimethylsiloxanediglycidyl ether, among them the cycloaliphatic diepoxides are particularly preferred and should be present as the main constituent. In contrast to commercially available triarylsulfonium salt and diaryliodonium salt initiators, the initiator combinations according to the invention are however also able to crosslink other non-cycloaliphatic epoxides, such as aliphatic or aromatic glycidyl ethers and their mixtures with olefin epoxides.

The initiator mixtures according to the invention can crosslink clear lacquers containing 50–90 wt. % of one or more cycloaliphatic diepoxides, preferably 3,4-epoxycyclohexyl-(3,4-epoxycyclohexylmethyl ester), and optionally containing additions of aromatic or aliphatic diglycidyl ethers and polyglycidyl ethers, olefin diepoxides such as for example vinylcyclohexene dioxide, limonene dioxide, butadiene diepoxide, 1,2,7,8-diepoxyoctane, epoxidized polybutadiene and OH-functional compounds, preferably diols such as for example propanediol-1,2 and -1,3, dipropylene glycol, diethylene, triethylene and tetraethylene glycol, butanediol-1,3 and -1,4, oligomeric tetramethylene glycols, hexanediol-1,6 or also polyester polyols and polyacrylate polyols with OH numbers of between 30 and 150 KOH/g polymer, the total amount of the aforementioned optional additives not exceeding 40 wt. % in the lacquer, in lacquer layers of 1 to 150 μm wet film thickness rapidly and with complete decolouration by irradiation with medium-pressure and high-pressure mercury vapour lamps that may in addition also be doped with metal ions such as Fe or Ga in order to broaden their emission range in the near-UV and visible spectra, the radiation doses required to produced tack-free surfaces being between 50 and 500 $mJ/cm^2$ for 50 μm-thick wet films.

The initiator mixtures used for this purpose consist of or include, referred to the clear lacquer composition, 0.5–2 wt. % of one or more 2,4,6-triarylpyrylium salts, preferably their hexafluorophosphates, and 0.5–6 wt. % of one or more photoradical initiators whose absorption maximum is below 350 nm, 2-hydroxy-2-methylacetophenone (Darocure-1173™) being particularly preferred.

There may also be used mixtures consisting of or comprising 0.5–2 wt. % of one or more 2,4,6-triarylpyrylium salts, preferably their hexafluorophosphates, and 0.5–5 wt. % of one or more aromatic olefins, 1,1-diphenylethylene being preferred, and 0.5–5 wt. % of one or more aromatic carbonyl compounds, diphenylacetaldehyde being preferred.

Those combinations are advantageous and preferred that include 0.5–2 wt. % of one or more 2,4,6-triarylpyrylium salts, preferably hexafluorophosphates, and 0.5–6 wt. % of one or more photoradical initiators whose absorption maximum lies below 350 nm, 2-hydroxy-2-methylacetophenone (Darocure-1173™) being particularly preferred, and 0.5–5 wt. % of one or more aromatic olefins, 1,1-diphenylethylene being particularly preferred.

The initiator mixtures are added to the clear lacquers, advantageously in the form of a solution in a polar-aprotic solvent, such as for example N,N-dimethylacetamide, propylene carbonate, tetramethyl urea, N,N'-diethylimidazolidinone, or γ-butyrolactone, wherein the proportion of the initiator solution in the clear lacquer should not be more than 10 wt. %, and should preferably be between 4 and 6 wt. %.

Particularly advantageous for achieving a high crosslinking rate, complete through-hardening, good surface quality and complete decolouration of even thick layers, are initiator combinations containing 0.7–1.5 wt. % of 2,4,6-triphenylpyrylium hexafluorophosphate, 1–2 wt. % of Darocure-1173™, 1–2 wt. % of 1,1-diphenylethylene and 5 wt. % of one of the aforementioned solvents, referred to the whole lacquer mixture.

By way of example a clear lacquer mixture consisting of 77.5 parts of 3,4-epoxycyclohexyl-(3,4-epoxycyclohexylmethyl ester) and 15 parts of limonene dioxide is crosslinked with 7.5 parts of an initiator solution that contains, referred to the whole lacquer, one part of 2,4,6-triphenylpyrylium hexafluorophosphate, 1.5 parts of Darocure-1173™, 1.5 parts of 1,1-diphenyethylene and 4 parts of γ-butyrolactone, completely in one pass using a Fe-doped medium-pressure mercury vapour lamp having an emission output of 300 W (FUSION SYSTEMS™) in a wet film thickness of 12 μm and a belt velocity of 50 m/min, to form a hard, solvent-resistant and colourless film, which corresponds to an irradiation dose of 80 mJ/$cm^2$.

In contrast to photocationic lacquer hardening by commercial triarylsulfonium hexafluorophosphate initiator solutions, when using the initiator combinations according to the invention in photocationically crosslinkable epoxide lacquer mixtures no environmentally harmful and toxic odiferous emissions that pollute the working environment are formed. The low amounts, due to the high molar extinction coefficients, of the 2,4,6-triarylpyrylium salts that are employed in the lacquers are also advantageous.

Particularly effective are the initiator systems according to the invention for UV crosslinking of pigmented epoxide lacquers, in particular white lacquers pigmented with $TiO_2$. On account of the intrinsic absorption of $TiO_2$ pigments below 400 nm for the rutile modification and below 370 nm for the anatase modification, it is not possible to crosslink photocationically epoxide lacquers pigmented in this way, especially in layer thicknesses of more than 5 μm, using conventional triarylsulfonium salt solutions. The use of sensitisers that have a better light absorption in the main emission region of the industrially used medium-pressure and high-pressure mercury vapour lamps and that can transmit energy to the triarylsulfonium salts no longer absorbing in this region, for example polycyclic aromatic compounds such as anthracene or pyrene and/or their polymer-bound derivatives and thioxanthones, such as in particular isopropylthioxanthone, is for many applications excluded on account of their possible toxicity or on account of the danger of yellowing.

On the other hand 2,4,6-triarylpyrylium salts, in particular 2,4,6-triphenylpyrylium hexafluorophosphate, also absorb above the absorption edges of the $TiO_2$ modifications and extending into the visible region of the spectrum. They can therefore also absorb in pigmented lacquers light from the preferably employed Fe-doped and Ga-doped medium-pressure and high-pressure mercury vapour lamps and take part in photoelectron transfer reactions with the electron donors of the initiator combinations according to the invention, to form initiating cations. Apart from the particularly preferred white pigment $TiO_2$ in its rutile and anatase modifications, other colour pigments that exhibit an often only slight light permeability in the wavelength region between 350 and 500 nm can be used either alone or mixed with one of the aforementioned $TiO_2$ modifications for the pigmenting.

Pigmented mixtures that can be photo-crosslinked with the initiator combinations according to the invention are characterised in that they contain between 1 and 45 parts of one or more pigments, preferably $TiO_2$ in its rutile or anatase modification, 50 to 95 parts of a binder or 50 to 95 parts of a binder mixture based on one or more cycloaliphatic epoxides, and 5 to 10 parts of a solution of the initiator combinations according to the invention.

Binders for pigmented photocationically crosslinkable layers include the aforementioned cycloaliphatic diepoxides, preferably 3,4-epoxycyclohexyl-(3,4-epoxycyclohexylmethyl esters) and may optionally contain additions of aromatic or aliphatic diglycidyl ethers and polyglycidyl ethers, olefin diepoxides such as for example vinylcyclohexene dioxide, limonene dioxide, butadiene diepoxide, 1,2,7,8-diepoxyoctane, epoxidized polybutadiene and OH-functional compounds, preferably diols such as for example propanediol-1,2 and -1,3, dipropylene glycol, di-, tri- and tetraethylene glycol, butanediol-1,3 and -1,4, oligomeric tetramethylene glycols, hexanediol-1,6 or also polyester polyols and polyacrylate polyols with OH numbers between 30 and 150 g KOH/g polymer, wherein the total amount of the aforementioned optional additives should not exceed 40 wt. % in the binder mixture.

The initiator mixtures used for pigmented lacquers comprise, referred to the whole lacquer composition, 0.7–2 wt. % of one or more 2,4,6-triarylpyrylium salts, preferably their hexafluorophosphates, and 1–10, preferably 2–8 wt. % of one or more photoradical initiators, 2-hydroxy-2-methylacetophenone (Darocure-1173™) being particularly preferred.

Furthermore there may also be used mixtures consisting of 0.7–2 wt. % of one or more 2,4,6-triarylpyrylium salts, preferably their hexafluorophosphates, and 0.5–8 wt. % of one or more aromatic olefins, 1,1-diphenylethylene being preferred, or 0.5–5 wt. % of one or more aromatic carbonyl compounds, such as for example diphenylacetaldehyde.

Those combinations are advantageous and preferred that include 0.7–2 wt. % of one or more 2,4,6-triarylpyrylium salts, preferably hexafluorophosphates, and 1–6 wt. % of one or more photoradical initiators whose absorption maximum lies below 350 nm, 2-hydroxy-2-methylacetophenone (Darocure-1173™) being particularly preferred, and 0.5–5 wt. % of one or more aromatic olefins, 1,1-diphenylethylene being particularly preferred.

The initiator mixtures are added to the pigmented lacquers, advantageously in the form of a solution in a polar-aprotic solvent such as for example N,N-dimethylacetamide, propylene carbonate, tetramethyl urea, N,N'-diethylimid-azolidinone, or γ-butyrolactone, wherein the proportion of the initiator solution in the lacquer should not exceed 10 wt. %, and should preferably be between 4 and 6 wt. %. Particularly advantageous for a high crosslinking rate, complete through-hardening, good surface quality and complete decolouration of even thick layers pigmented with $TiO_2$ are initiator solutions containing 0.7–2 wt. % of 2,4,6-triphenylpyrylium hexafluorophosphate, 2–6 wt. % of Darocure-1173™ and 1–2 wt. % of 1,1-diphenylethylene, and 5 wt. % of one of the aforementioned solvents, referred to the whole lacquer mixture. The composition of the initiator combinations is governed in the case of pigmented lacquers by the layer thickness to be applied, the pigment/binder ratio, and the absorption behaviour of the pigment that is used, so that also higher concentrations of constituents of the initiator combination can be employed.

The production of pigmented lacquers that contain the initiator combinations according to the invention may be carried out according to processes known to the person skilled in the art, for example by dispersing the pigments in a binder using a high-speed rotating disperser, or grinding in a triple roll mill or in a ball mill. Advantageously the solution of the initiator combination is added and mixed in only after the pigments have been incorporated into the mixtures. In the production of the crosslinking mixtures there may also be added conventional additives such as for example defoaming agents, thixotropic agents, flow-control agents, coupling agents, antioxidants and UV stabilisers, in the amounts conventionally used for the relevant application and that are known to the person skilled in the art.

The application of the pigmented mixtures containing the initiator combinations according to the invention, to the substrates to be coated, such as steel, tinplate, aluminium, paperboard, cardboard, paper, glass and various plastics in film, foil or sheet form may be effected by the conventional and known processes such as rolling, spraying or dipping.

The photocationically crosslinkable unpigmented and pigmented mixtures based on cycloaliphatic epoxides and containing the initiator combinations according to the invention may be employed, after hardening by suitable light sources, preferably medium-pressure and high-pressure mercury vapour lamps with a main emission in the wavelength region above 320 nm, as lacquers for packaging materials, automobile parts, domestic appliances, housings and furniture, for producing lacquered steel and aluminium strips, as printing inks on metal, plastics, paper and paperboard, and as UV-hardenable adhesives, the composition of the binders being able to be adapted in each case to the relevant requirements.

Pigmented and unpigmented mixtures based on cycloaliphatic epoxides containing the initiator combinations according to the invention may particularly advantageously be applied to metallic substrates, to which they firmly adhere on account of the low tendency of the epoxide binders to shrink, and due to the high extinction coefficients of the 2,4,6-triarylpyrylium salts they can be UV-crosslinked in layer thicknesses of 1 to 150 μm.

The main technical advantages of the initiator combinations according to the invention are based on the broad UV-absorption range of the 2,4,6-triarylpyrylium salts that are used, which depending on the substitution of the phenyl substituents extends far into the visible region of the spectrum and overlaps extremely well the emission range of the industrially used lamps, as well as on the high molecular decadic extinction coefficients of the pyrylium compounds that are used, and the very low amounts of these compounds in the epoxide mixtures to be crosslinked means that it is also possible to crosslink pigmented lacquers and printing inks, accompanied by the complete decolouration of the pyrylium salts, with the result that no colour falsifications occur and the crosslinked layers have a negligible odour and do not emit any troublesome or toxic components.

Such photocationically hardenable unpigmented and pigmented systems containing the initiator combinations according to the invention can advantageously be used for the coating of metal and plastics substrates after appropriate preliminary treatment of the surface, and as printing inks for paper, paperboard, and aluminium and plastics sheets, foils and films. A particular advantage is the possibility of also being able to through-harden substantially thicker layers of up to 150 μm, so that areas of application in which these higher coating thicknesses are required can also be exploited.

The action of the initiator combinations according to the invention in the photocationic crosslinking of epoxide binders can be demonstrated with the aid of the following examples.

EXAMPLES

Test Methods

Liquid lacquer mixtures were applied in wet film thicknesses of 76 μm or 50 μm using lacquer applicators to glass plates (18×12×0.2 cm) and exposed to a UV irradiation apparatus (FUSION SYSTEMS, Gaithersburg, Md., USA) consisting of a F-300 lamp with a Fe-doped high-pressure mercury burner (D bulb) having a main emission between 350 and 420 nm and an LC-6 conveyor device with a variable velocity between 15 and 75 m/min operating at a belt velocity of 16 m/min, until the lacquer layer was through-hardened and its surface was tack-free.

The incident UV intensity in $mJ/cm^2$ between 320 and 450 nm during an exposure pass was measured with a UVICURE radiometer (EIT, Sterling, Va., USA) at different belt velocities, the measurement values were plotted against the belt velocities on a diagram, and the resulting calibration curve was used to determine the minimum UV dose required to produce a tack-free lacquer surface and a through-hardened lacquer layer. The incident dose at a velocity of 10×16 m/min was 1.8 J/cm$^2$, at 1×5 m/min was 550 mJ/cm$^2$, at 1×16 m/min was 190 mJ/cm$^2$, and at 1×50 m/min was 60 mJ/cm$^2$. The exposed lacquer films were rubbed with an absorbent paper impregnated with methyl ethyl ketone (MEK). A MEK-resistance of ≧75 double strokes (DS) without the film dissolving or swelling, or the surface suffering abrasion, is regarded as very good.

All percentages in the examples refer to the whole lacquer mixtures.

Example 1 a.) 0.1 g, b.) 0.4 g and c.) 1 g of a 2,4,6-triphenyl-pyrylium hexafluorophosphate (TPP-PF$_6$) solution (25% in γ-butyrolactone) were added to separate mixtures of 4 g of 3,4-epoxycyclohexyl-3,4-epoxycyclohexylmethyl ester) and 1 g of limonene dioxide, and the whole was thoroughly mixed. The TPP-PF$_6$ initiator salt concentration in a.) was 0.5 wt. %, in b.) was 2 wt. %, and in c.) was 5 wt. %. The lacquers were applied, UV-crosslinked and tested as described in the test methods. The results are shown in Table 1.

Example 2 a.) 0.1 g (0.5 wt. % of salt), b.) 0.4 g (2 wt. %) and c.) 1 g (5 wt. %) of a TPP-PF$_6$ solution (25% in γ-butyrolactone) as well as in each case 0.8 wt. % of 2-hydroxy-2-methyl-acetophenone (Darocure-1173™) were added to separate mixtures of 4 g of 3,4-epoxycyclohexyl-3,4-epoxycyclo-hexylmethyl ester) and 1 g of limonene dioxide, and the whole was thoroughly mixed. The lacquers were applied, UV-crosslinked and tested as described in the test methods. The results are shown in Table 1.

Example 3 a.) 0.1 g (0.5 wt. %), b.) 0.4 g (2 wt. %) and c.) 1 g (5 wt. %) of TPP-PF$_6$ solution (25% in γ-butyrolactone) as well as in each case 4.0 wt. % of 2-hydroxy-2-methylacetophenone (Darocure-1173™) were added to separate mixtures of 4 g of 3,4-epoxycyclohexyl-3,4-epoxycyclohexylmethyl ester) and 1 g of limonene dioxide, and the whole was thoroughly mixed. The lacquers were applied, UV-crosslinked and tested as described in the test methods. The results are shown in Table 1.

Example 4

0.30 g of TPP-PF$_6$ solution (25% in γ-butyrolactone)=1.4 wt. % of initiator salt and a.) 0.075 g (1.4 wt. %) of ω,ω-diethoxyacetophenone, b.) 0.1 g (1.8 wt. %) of diphenyl-(2,4,6-trimethylbenzoyl)phosphine oxide (Lucirin-TPO™) and c.) 0.075 g (1.3 wt. %) of diphenyl(2,4,6-trimethylbenzoyl)phosphine oxide+0.11 g (2.0 wt. %) of 2-hydroxy-2-methylacetophenone were added to separate mixtures of 4 g of 3,4-epoxycyclohexyl-(3,4-epoxycyclohexylmethyl ester) and 1 g of limonene dioxide, and the whole was thoroughly mixed. The lacquers were applied, UV-crosslinked and tested as described in the test methods. The results are shown in Table 1.

Example 5

0.30 g of a TPP-PF$_6$ solution (25% in γ-butyrolactone)= 1.5 wt. % of initiator salt and a.) 0.1 g (2.0 wt. %) of diphenylacetaldehyde, b.) 0.075 g (1.5 wt. %) of 1,1-diphenylacetone and c.) 0.10 g (2.0 wt. %) of triphenylac-etophenone were added to separate mixtures of 4 g of 3,4-epoxycyclohexyl-(3,4-epoxycyclohexylmethyl ester) and 1 g of limonene dioxide, and the whole was thoroughly mixed. The lacquers were applied, UV-crosslinked and tested as described in the test methods. The results are shown in Table 1.

Example 6

0.20 g of a TPP-PF$_6$ solution (25% in γ-butyrolactone)= 1.0 wt. % of initiator salt referred to the lacquer, and a.) 0.075 g (1.5 wt. %) of triphenylethylene, b.) 0.075 g (1.5 wt. %) of trans-stilbene and c.) 0.075 g (1.5 wt. %) of 1,1-diphenylethylene were added to separate lots of 5 g of 3,4-epoxycyclohexyl-(3,4-epoxycyclohexylmethyl ester), and the whole was thoroughly mixed. The lacquers were applied, UV-crosslinked and tested as described in the test methods. The results are shown in Table 1.

Example 7

0.15 g of a TPP-PF$_6$ solution (25% in γ-butyrolactone)= 0.75 wt. % of initiator salt and 0.075 g (1.4 wt. %) of 2-hydroxy-2-methylacetophenone and a.) 0.075 g (1.4 wt. %) of triphenylethylene, b.) 0.075 g (1.4 wt. %) of trans-stilbene=1.5 wt. %, and c.) 0.075 g (1.4 wt. %) of 1,1-diphenyl-ethylene were added to separate lots of 5 g of 3,4-epoxycyclohexyl-(3,4-epoxycyclohexylmethyl ester), and the whole was thoroughly mixed. The lacquers were applied, UV-crosslinked and tested as described in the test methods. The results are shown in Table 1.

Example 8

0.35 g of a TPP-PF$_6$ solution (25% in γ-butyrolactone)= 1.3 wt. % of initiator salt and a.) 0.08 g (1.5 wt. %) of tert-butyl hydroperoxide, b.) 0.08 g (1.5 wt. %) of tert-butyl perbenzoate and c.) 0.075 g (1.4 wt. %) of dicumyl peroxide were added to separate mixtures of 4 g of 3,4-epoxycyclohexyl-(3,4-epoxycyclohexylmethyl ester) and 1 g of limonene dioxide, and the whole was thoroughly mixed. The lacquers were applied, UV-crosslinked and tested as described in the test methods. The results are shown in Table 1.

Example 9

0.30 g of a solution of 2,4,6-tris-(4,4'-biphenylyl)-pyrylium hexafluorophosphate (TBP-PF$_6$) (10% in γ-butyrolactone)=0.6 wt. % of initiator salt was added to a mixture of 4 g of 3,4-epoxycyclohexyl-(3,4-epoxycyclohexylmethyl ester) and 1 g of limonene dioxide, and the whole was thoroughly mixed. The lacquers were applied, UV-crosslinked and tested as described in the test methods. The results are shown in Table 1.

Example 10

0.30 g of a solution of 2,4,6-tris-(4,4'-biphenylyl)-pyrylium hexafluorophosphate (TBP-PF$_6$) (10% in γ-butyrolactone)=0.6 wt. % of initiator salt and 0.2 g (3.6 wt. %) of 2-hydroxy-2-methylacetophenone were added to a mixture of 4 g of 3,4-epoxycyclohexyl-(3,4-epoxycyclohexylmethyl ester) and 1 g of limonene dioxide, and the whole was thoroughly mixed. The lacquers were applied, UV-crosslinked and tested as described in the test methods. The results are shown in Table 1.

Example 11

0.50 g of a solution of 2,4,6-tris-(1,1'-biphenyl-4-yl)-pyrylium hexafluorophosphate (TBP-PF$_6$) (10% in propylene carbonate/limonene dioxide 2:3))=1.0 wt. % of initiator salt, 0.2 g (3.5 wt. %) of 2-hydroxy-2-methylacetophenone and 0.1 g (1.9 wt. %) of 1,1-diphenylethylene were added to a mixture of 4 g of 3,4-epoxycyclohexyl-(3,4-epoxycyclohexylmethyl ester) and 1 g of limonene dioxide, and the whole was thoroughly mixed. The lacquers were applied, UV-crosslinked and tested as described in the test methods. The results are shown in Table 1.

Example 12 a.) 0.25 g of a TPP-PF$_6$ solution (25% in γ-butyrolactone)=1.1 wt. % of initiator salt and 0.22 g (4.0 wt. %) of 2-hydroxy-2-methylacetophenone were added to 5 g of limonene dioxide, UV-irradiated and tested.

b.) 0.30 g of a TPP-PF$_6$ solution (25% in γ-butyrolactone)=1.3 wt. % of initiator salt, 0.075 g (1.3 wt. %) of 2-hydroxy-2-methylacetophenone and 0.075 g (1.3 wt. %) of 1,1-diphenylethylene were added to 5 g of limonene dioxide, UV-irradiated and tested.

c.) For purposes of comparison 5 g of limonene dioxide were mixed with 0.30 g of a triarylsulfonium hexafluorophosphate solution (UVI-6990™, 50% in γ-butyrolactone), UV-irradiated and tested. The results are shown in Table 2.

In the case of a.) and b.) elastic tack-free films had formed that were completely soluble in MEK, which indicates that only one epoxide group of the limonene dioxide had undergone polymerisation. Gel chromatography against polystyrene standards of polymer samples of films a.) and b.) dissolved in THF showed a number average $M_N$ of the resultant polymers of 2–3,000 g/mole. The lacquer c.) was liquid even at 10×16 m/min.

Example 13

0.38 g of a solution of TPP-PF$_6$ (25% in γ-butyrolactone)=1.5 wt. % of initiator salt, 0.075 g (1.3 wt. %) of 2-hydroxy-2-methylacetophenone, and 0.075 g (1.3 wt. %) of 1,1-diphenylethylene=1.5 wt. % referred to the lacquer, were added to 5 g of hexanediol-1,6 diglycidyl ether, and the mixture was UV-crosslinked and tested. The results are shown in Table 2.

Example 14

5 g of 1,2,7,8-diepoxyoctane were UV-crosslinked with 0.30 g of TPP-PF$_6$ solution (25% in γ-butyrolactone)=1.3 wt. % of initiator salt, 0.09 g (1.5 wt. %) of 2-hydroxy-2-methylacetophenone, and 0.075 g (1.3 wt. %) of 1,1-diphenylethylene, and tested. The results are shown in Table 2.

Example 15

0.13 g of TPP-PF$_6$ solution (25% in γ-butyrolactone)=0.5 wt. % of initiator salt, 0.11 g (2.0 wt. %) of 2-hydroxy-2-methylacetophenone, and 0.11 g (2.0 wt. %) of 1,1-diphenylethylene were added to a mixture of 4 g of 3,4-epoxycyclohexyl-(3,4-epoxycyclohexylmethyl ester) and 1 g of limonene dioxide, and the whole was thoroughly mixed. The lacquers were applied, UV-crosslinked and tested as described in the test methods. The results are shown in Table 2.

Example 16

0.20 g of a TPP-PF$_6$ solution (25% in γ-butyrolactone)=1.1 wt. % of initiator salt, 0.09 g (2.0 wt. %) of 2-hydroxy-2-methylacetophenone, and 0.09 g (2.0 wt. %) of trans-stilbene were added to a mixture of 1 g of 3,4-epoxycyclohexyl-(3,4-epoxycyclohexylmethyl ester) and 3 g bisphenol-A diglycidyl ether, and the whole was thoroughly mixed. The lacquers were applied, UV-crosslinked and tested as described in the test methods. The results are shown in Table 2.

Example 17

0.18 g of a TPP-PF$_6$ solution (25% in γ-butyrolactone)=0.9 wt. % of initiator salt, 0.09 g (1.8 wt. %) of 2-hydroxy-2-methylacetophenone, and 0.09 g (1.8 wt. %) of 1,1-diphenyl-ethylene were added to a mixture of 2 g of hexanediol-1,6-diglycidyl ether and 2 g of limonene dioxide, and the whole was thoroughly mixed. The lacquers were applied, UV-crosslinked and tested as described in the test methods. The results are shown in Table 2.

Example 18

0.15 g of a TPP-PF$_6$ solution (25% in γ-butyrolactone)=0.75 wt. % of initiator salt, 0.09 g (2.0 wt. %) of 2-hydroxy-2-methylacetophenone, and 0.09 g (2.0 wt. %) of 1,1-diphenylethylene were added to a mixture of 2 g of bisphenol-A diglycidyl ether and 2 g of limonene dioxide, and the whole was thoroughly mixed. The lacquers were applied, UV-crosslinked and tested as described in the test methods. The results are shown in Table 2.

Example 19

0.25 g of a TPP-PF$_6$ solution (25% in γ-butyrolactone)=1.15 wt. % of initiator salt and 0.1 g (1.9 wt. %) of triphenylacetophenone were added to a mixture of 4.0 g of 3,4-epoxycyclohexyl-(3,4-epoxycyclohexylmethyl ester) and 1.0 g of a polycaprolactone triol (OH no.: 85 mg KOH/g), and the whole was thoroughly mixed. The lacquers were applied, UV-crosslinked and tested in the test methods. The results are shown in Table 2.

Example 20

0.15 g of a TPP-PF$_6$ solution (20% in γ-butyrolactone)=0.7 wt. % of initiator salt, 0.02 g (0.5 wt. %) of 2-hydroxy-2-methylacetophenone and 0.02 g (0.5 wt. %) of 1,1-diphenylethylene were added to a mixture of 3.6 g of 3,4-epoxycyclohexyl-(3,4-epoxycyclohexylmethyl ester) and 0.4 g butanediol-1,3, and the whole was thoroughly mixed. The lacquers were applied, UV-crosslinked and tested as described in the test methods. The results are shown in Table 2.

Example 21

0.15 g of a TPP-PF$_6$ solution (20% in γ-butyrolactone)=0.7 wt. % of initiator salt, 0.02 g (0.5 wt. %) of 2-hydroxy- 2-methylacetophenone and 0.02 g (0.5 wt. %) of 1,1-diphenylethylene were added to a mixture of 2.8 g of 3,4-epoxycyclohexyl-(3,4-epoxycyclohexylmethyl ester) and 1.2 g of epoxycyclohexylmethanol, and the whole was thoroughly mixed. The lacquers were applied, UV-crosslinked and tested as described in the test methods. The results are shown in Table 2.

Example 22

4 g (16.2 wt. %) of $TiO_2$ (anatase) (KRONOS 1071) were dispersed for 10 minutes at 2–5,000 r.p.m. in 15 g of 3,4-epoxycyclohexyl-(3,4-epoxycyclohexylmethyl ester) by means of a disperser (VGA Getzmann) in a 250 ml beaker. A solution of 5 g of 3,4-epoxycyclohexyl-(3,4-epoxycyclohexylmethyl ester), 0.60 g of a TPP-PF6 solution (20% in γ-butyrolactone)=0.61 wt. %, and 0.12 g (0.5 wt. %) of 1,1-diphenylethylene was then added thereto, the white lacquer was homogenised to a yellow dispersion at a low rotational speed, was applied as 75 μm thick layers to glass plates and deep-drawing sheets (18×10×0.1 cm), UV-crosslinked by 10 lamp passes at 16 m/min, and tested. Already after two passes the lacquer surfaces were white due to decolouration. After 6–8 passes the lacquer substrate was also decoloured and hard, as was established by tests on glass plates. The resulting lacquers had cured to soft, only slightly scratch-resistant white lacquers having a matt surface. The resistance to MEK was <30 double strokes before surface abrasion occurred.

Example 23

4 g (12.8 wt. %) of $TiO_2$ (anatase) (KRONOS 1071) were dispersed for 10 minutes at 2–5,000 r.p.m. in 14.5 g 3,4-epoxycyclohexyl-(3,4-epoxycyclohexylmethyl ester) by means of a disperser (VGA Getzmann) in a 250 ml beaker. A solution of 5 g of 3,4-epoxycyclohexyl-(3,4-epoxycyclohexylmethyl ester), 0.60 g of a TPP-PF6 solution (20% in γ-butyrolactone)=0.5 wt. %, and 0.2 g (0.7 wt. %) of 2-hydroxy-2-methylacetophenone and 6.3 g of a solution of 1.3 g of polycaprolactone triol (OH No. 85 mg KOH/g) in 5 g of 3,4-epoxycyclohexyl-(3,4-epoxycyclohexylmethyl ester) were then added thereto, the white lacquer was homogenised to a yellow dispersion at a low rotational speed, was applied as 75 μm thick layers to glass plates and deep-drawing sheets (18×10×0.1 cm), UV-crosslinked by 10 lamp passes at 16 m/min, and tested. Already after two passes the lacquer layers were white due to decolouration. After the exposure the lacquers were post-treated for 10 minutes at 100° C. The resulting lacquers had cured to form soft white lacquers having a glossy surface. The scratch resistance of the surface was better than in example 23. The resistance to MEK was <40 double strokes before surface abrasion occurred.

Example 24

10 g (17.8 wt. %) of $TiO_2$ (anatase) (KRONOS 1071) were dispersed for 10 minutes at 2–5,000 r.p.m. by means of a disperser (VGA Getzmann) in 30 g of 3,4-epoxycyclohexyl-(3,4-epoxycyclo-hexylmethyl ester), in a 250 ml beaker. A solution of 10 g of 3,4-epoxycyclohexyl-(3,4-epoxycyclo-hexylmethyl ester), 2.50 g of a TPP-$PF_6$ solution (25% in γ-butyrolactone)=1.1 wt. % and 3.6 g (8.9 wt. %) of 2-hydroxy-2-methylacetophenone was then added thereto, the white lacquer was homogenised to a yellow dispersion at a low rotational speed, and was applied as 76 μm thick layers to glass plates and deep-drawing sheets (18×10×0.1 cm), UV-crosslinked by 10 lamp passes at 16 m/min, and tested. Already after one pass the lacquer surface was white and the substrate was decolourised after 7 passes. The lacquer mixture was also crosslinked in the form of a 12 μm thick layer on glass and steel sheet, and had already hardened and was white after 3×16 m/min. The resulting lacquers had hardened to form hard, scratch-resistant white lacquers having a matt surface. The resistance to MEK was >75 double strokes before any surface abrasion occurred.

Example 25

10 g (19.1 wt. %) of $TiO_2$ (anatase) (KRONOS 1071) were dispersed for 10 minutes at 2–5,000 r.p.m. by means of a disperser (VGA Getzmann) in 30 g of 3,4-epoxycyclohexyl-(3,4-epoxycyclohexylmethyl ester), in a 250 ml beaker. A solution of 10 g of 3,4-epoxycyclohexyl-(3,4-epoxycyclo-hexylmethyl ester), 3.5 g (5.8 wt. %) of epoxycyclohexyl-methanol, 2.40 g of a TPP-$PF_6$ solution (25% in γ-butyrolactone)=1.0 wt. %, 3.6 g (5.8 wt. %) of 2-hydroxy-2-methylacetophenone and 0.6 g (1.0 wt. %) of 1,1-diphenyl-ethylene was then added thereto, the white lacquer was homogenised to a yellow dispersion at a low rotational speed, and was applied as 76 μm thick layers to glass plates and deep-drawing sheets (18×10×0.1 cm), crosslinked by 10 lamp passes at 16 m/min, and tested. Even after one pass the lacquer surface was white and the substrate had hardened after 6 passes. The lacquer mixture was also crosslinked in the form of a 12 μm thick layer on glass and steel sheet, and had hardened and was white after 3×16 m/min. The resulting lacquers had hardened to form hard, scratch-resistant white lacquers with a high-gloss, defect-free surface. The resistance to MEK was >75 double strokes before any surface abrasion occurred.

TABLE 1

Results of the UV-cationic Lacquer Crosslinking Experiments:

| Example | | Film Thickness (μm) | Lamp Passes | Belt Velocity (m/min) | Hardening Dose (mJ/cm²) | MEK Resistance (DS) | Appearance |
|---|---|---|---|---|---|---|---|
| 1 | a | 76 | 12 | 16 | 2,300 | <20 | soft, yellow, shiny |
|   | b |    | 6  | 16 | 1,200 | <50 | hard, yellow, shiny |
|   | c |    | 6  | 16 | 1,200 | ≧75 | hard, deep yellow, matt |

TABLE 1-continued

Results of the UV-cationic Lacquer Crosslinking Experiments:

| Example | | Film Thickness (μm) | Lamp Passes | Belt Velocity (m/min) | Hardening Dose (mJ/cm²) | MEK Resistance (DS) | Appearance |
|---|---|---|---|---|---|---|---|
| 2 | a | 76 | 12 | 16 | 2,300 | <40 | soft, colourless, shiny |
|   | b |    | 5  |    | 850   | ≧75 | hard, colourless, shiny |
|   | c |    | 3  |    | 600   | ≧75 | hard, colourless, shiny |
| 3 | a | 76 | 10 | 16 | 1,900 | <10 | soft, colourless |
|   | b |    | 3  |    | 600   | ≧75 | hard, colourless, shiny |
|   | c |    | 3  |    | 600   | ≧75 | hard, yellow, opaque |
| 4 | a | 76 | 6  | 16 | 1,200 | <50 | flexible, pale yellow |
|   | b |    | 5  |    | 950   | <30 | soft, tacky, yellow |
|   | c |    | 5  |    | 950   | ≧75 | hard, tack-free, colourless |
| 5 | a | 76 | 6  | 16 | 1,200 | ≧75 | hard, colourless, shiny |
|   | b |    | 5  |    | 950   | ≧75 | hard, colourless, shiny |
|   | c |    | 9  |    | 1,700 | <50 | hard, surface shrinkage, yellowish |
| 6 | a | 50 | 6  | 16 | 1,200 | <55 | soft, slightly yellowish |
|   | b |    | 5  |    | 950   | <60 | soft, yellow |
|   | c |    | 5  |    | 950   | <60 | soft, colourless, shiny |
| 7 | a | 50 | 5  | 16 | 950   | ≧75 | hard, slightly yellowish |
|   | b |    | 4  |    | 750   | ≧75 | hard, colourless, shiny |
|   | c |    | 3  |    | 550   | ≧75 | hard, colourless, shiny |
| 8 | a | 76 | 5  | 16 | 950   | <50 | soft, brownish |
|   | b |    | 3  |    | 550   | ≧75 | hard, colourless |
|   | c |    | 6  |    | 1,200 | <45 | soft, brownish |
| 9 |   | 50 | 7  | 16 | 1,400 | <10 | soft, tacky, decoloured |
| 10 |  | 50 | 4  | 16 | 750   | <20 | soft, tack-free, colourless |
| 11 |  | 50 | 2  | 16 | 350   | ≧75 | hard, tack-free, colourless |

TABLE 2

Results of the UV-cationic Lacquer Crosslinking Experiments:

| Example | | Film Thickness (μm) | Lamp Passes | Belt Velocity (m/min) | Hardening Dose (mJ/cm²) | MEK Resistance (DS) | Appearance of the Lacquer Layers |
|---|---|---|---|---|---|---|---|
| 12 | a | 50 | 4  | 16 | 750   | 0   | soft, tacky, pale yellow |
|    | b | 50 | 2  |    | 350   | 0   | soft, tack-free, colourless |
|    | c | 50 | 1  |    | 190   | 0   | liquid, pale yellow |
| 13 |   | 50 | 10 | 16 | 1,900 | <60 | soft, decoloured |
| 14 |   | 50 | 1  | 16 | 190   | ≧75 | hard, shiny, colourless |
|    |   | 12 | 1  | 50 | 60    | ≧75 | hard, shiny, colourless |
| 15 |   | 50 | 1  | 16 | 190   | ≧75 | hard, shiny, colourless |
|    |   | 12 | 1  | 25 | 120   | ≧75 | hard, shiny, colourless |
| 16 |   | 50 | 9  | 16 | 1,700 | <50 | hard, pale yellow, matt |
|    |   | 12 | 2  | 16 | 350   | ≧75 | hard, colourless, matt |
| 17 |   | 50 | 3  | 16 | 550   | ≧75 | elastic, colourless, shiny |
| 18 |   | 76 | 8  | 16 | 1,500 | <50 | hard, pale yellow |
| 19 |   | 50 | 2  | 16 | 350   | <60 | hard, surface shrinkage yellowish, matt |
| 20 |   | 50 | 2  | 16 | 350   | ≧75 | hard, shiny, colourless |
| 21 |   | 50 | 1  | 16 | 190   | ≧75 | hard, shiny, colourless |

What is claimed is:

1. Photocationic initiator combination comprising (a) at least one 2,4,6-triarylpyrylium salt of the general formula (I)

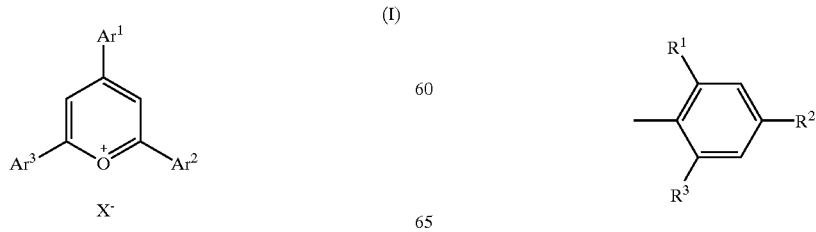

wherein X⁻ denotes a non-nucleophilic anion and Ar¹, Ar² and Ar³ independently of one another in each case denote a phenyl group of the general formula (II) or a biphenyl group of the general formula (III), -continued

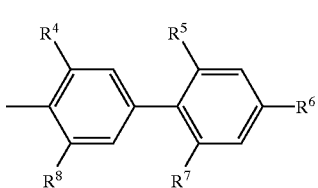

(III)

wherein $R^1$ to $R^8$ independently of one another in each case denote hydrogen or an alkyl or alkoxy group with 1 to 12 carbon atoms, and
  (b) at least one electron donor that forms cations under the action of light in the presence of the aforementioned 2,4,6-triarylpyrylium salt,
  wherein the electron donor is
    (i) a combination of an aromatic olefin and an aromatic carbonyl compound with in each case at least two unsubstituted phenyl groups or $C_1$–$C_{12}$-alkyl or $C_1$–$C_{12}$- alkoxy substituted phenyl groups and/or
    (ii) a radical forming peroxy or azo compound.

2. Photocationic initiator combination according to claim 1, wherein $X^-$ denotes $PF_6^-$, $SbF_6^-$, $AsF_6^-$ or $[B(C_6F_5)_4]^-$.

3. Photocationic initiator combination according to claim 1, wherein the long wavelength UV-absorption maxima of the 2,4,6-triarylpyrylium salt(s) lie between 350 and 420 nm.

4. Photocationic initiator combination according to claim 1, comprising as further electron donor, one or more photoradical initiators that form radicals under the action of light.

5. UV-crosslinkable epoxide mixture comprising a photocationic initiator combination according to claim 1.

6. UV-crosslinkable epoxide mixture according to claim 5, wherein the photocationic initiator combination is in an amount of 2 to 8 wt. % referred to the total amount of the mixture, the amount of the 2,4,6-triarylpyrylium salt being 0.5 to 2 wt. % referred to the total amount of the mixture.

7. UV-crosslinkable epoxide mixture comprising a photocationic initiator combination according to claim 4, wherein the amount of the 2,4,6-triarylpyrylium salt is 0.5 to 2 wt. %, the amount of the photoradical initiator is 0.5 to 6 wt. %, and the amount of the olefin is 0.5 to 5 wt. %, in each case referred to the total amount of the mixture.

8. UV-crosslinkable epoxide mixture according to claim 5, wherein the amount of the 2,4,6-triarylpyrylium salt is 0.5 to 2 wt. % and the amount of the peroxy compound(s) or azo compound(s) is 1 to 5 wt. %, in each case referred to the total amount of the mixture.

9. UV-crosslinkable epoxide mixture according to claim 5, comprising 50 to 90 wt. % of one or more cycloaliphatic diepoxides and 0 to 40 wt. % of additional olefin epoxides or hydroxyfunctional low molecular weight or high molecular weight compounds, in each case referred to the total amount of the mixture.

10. UV-crosslinkable epoxide mixture according to claim 5, comprising one or more pigments.

11. UV-crosslinkable epoxide mixture according to claim 10, wherein the pigment is titanium dioxide [$TiO_2$].

12. Process for printing or lacquering a substrate, comprising the following stages:
  (a) application of a film of a UV-crosslinkable epoxide mixture according to one of claims 5 to 11 to the substrate, and
  (b) irradiation with UV light of the film formed in stage (a).

13. Process according to claim 12, additionally comprising a thermal post-treatment stage.

* * * * *